(12) United States Patent
Takamatsu et al.

(10) Patent No.: US 6,203,853 B1
(45) Date of Patent: Mar. 20, 2001

(54) MATERIAL FOR INVERTING STATIC ELECTRICITY METHOD FOR REMOVING STATIC ELECTRICITY CROP RAISING HOUSE AND METHOD FOR RAISING CROP

(75) Inventors: Kuniaki Takamatsu, 55, Takamatsu, Kaminoyama-shi, Yamagata 999-31; Toyoko Ohara, Nara; Hideaki Kikuchi, Osaka; Kenichi Umeda, Kamoto-gun; Kennosuke Tanaka, Tokyo; Taichiro Nakayama, Kyoto, all of (JP)

(73) Assignees: Kuniaki Takamatsu, Yamagata; Nariko Ohara, Nara; Yoshiaki Ito, Nagoya, all of (JP)

( * ) Notice: Subject to any disclaimer, the term of this patent is extended or adjusted under 35 U.S.C. 154(b) by 0 days.

(21) Appl. No.: 09/378,301

(22) Filed: Aug. 20, 1999

Related U.S. Application Data

(62) Division of application No. 08/662,806, filed on Jun. 12, 1996, now abandoned.

(30) Foreign Application Priority Data

Jun. 12, 1995 (JP) .................................................. 7-144729

(51) Int. Cl.$^7$ ............................ C23C 16/40; C23C 16/24
(52) U.S. Cl. .................................. 427/255.37; 427/255.7
(58) Field of Search ............................ 427/255.37, 255.7; 47/17

(56) References Cited

U.S. PATENT DOCUMENTS 5,279,853 * 1/1994 Occhiello et al. .................. 427/162
5,404,073 * 4/1995 Tong et al. ........................... 313/479
5,742,119 * 4/1998 Aben et al. .......................... 313/479
5,899,708 * 5/1999 Tanaka et al. ....................... 438/149

FOREIGN PATENT DOCUMENTS 6-079822 * 8/1992 (JP) .

* cited by examiner

Primary Examiner—Shrive Beck
Assistant Examiner—Bret Chen
(74) Attorney, Agent, or Firm—Darby & Darby

(57) ABSTRACT

The material for inverting static electricity (or static electricity inverting material) of the present invention contains Si or $SiO_x$ ($0<x<2$) on the surfaces or inside of a base material. The Si or $SiO_x$ may be directly vapor-deposited on the base material. Or a silicon sheet prepared from a raw material of Si or $SiO_x$ may be attached to the base material. Furthermore, in the case where the static electricity inverting material contains the Si or $SiO_x$ thereinside, the Si or $SiO_x$ may be sandwiched or mixed in the base material. Moreover, the base material may be singly composed of the Si or $SiO_x$.

The invention provides also a method for removing static electricity by covering the surface of a static electricity producing body partly or totally with the static electricity inverting material, alternately, by covering a space accommodating a static electricity receiving body which is electrically charged through connection with the external space with the static electricity inverting material.

The invention still further provides a crop raising house using the static electricity inverting material as a transparent material, and yet further a method for raising crops in the crop raising house.

19 Claims, 6 Drawing Sheets

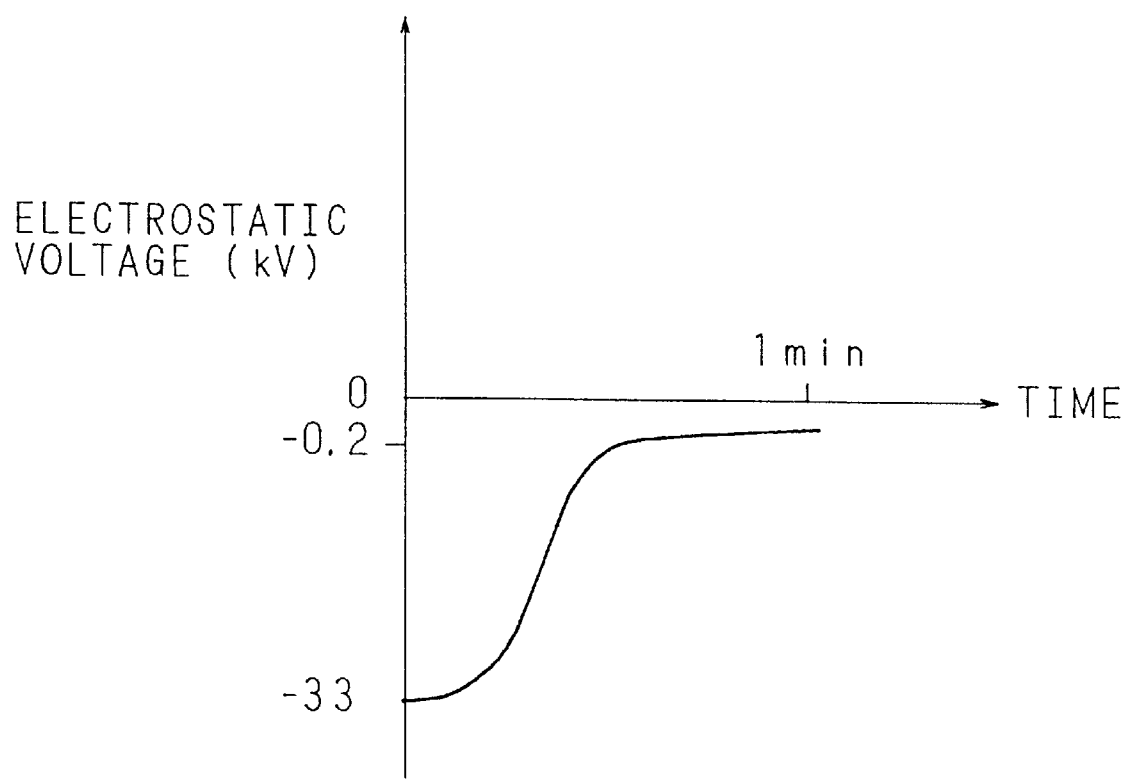

MATERIAL FOR INVERTING STATIC ELECTRICITY METHOD FOR REMOVING STATIC ELECTRICITY CROP RAISING HOUSE AND METHOD FOR RAISING CROP

This is a division, of application Ser. No. 08/662,806, filed Jun. 12, 1996, now abandoned. Each of these prior applications is hereby incorporated herein by reference, in its entirety.

BACKGROUND OF THE INVENTION

1. Field of the Invention

The present invention relates to a material for inverting positive static electricity (hereinafter referred also to as "static electricity inverting material") and to a method for removing static electricity. The invention also relates to a crop rasing house used for keeping warm or sheltering crops from outside, and to a method for raising crops with the use of the crop raising house.

2. Description of Related Art

While there are cases where the static electricity is used advantageously, the static electricity may sometimes lead to the following harmful effects. Namely, when the static electricity is generated, there arise dynamic troubles such as adhesion or tangling of electrically charged material such as powders, fibers, sheets and the like to another material. Furthermore, in some cases, a combustible substance or an explosive substance takes fire or explodes when the static electricity is discharged. When a human body is charged with electricity, he or she receives electric shocks when discharging the electricity through contact with a grounded conductor. Moreover, the static electricity may be a cause for break, erroneous operation, or deterioration of quality in precision devices including semiconductor parts.

It has been said that the positive static electricity affects human bodies, causing kinds of diseases and troubles in health. In a positive electrostatic environment, the amount of cations existing in the air is high, so that the amount of cations in a human body increases correspondingly. As a result, the human body fails to actively undergo metabolic change thereby to decrease resistances to disease to be frequently taken ill. For instance, cations induce shoulder stiffness or sleep. On the other hand, anions favorably influence and activate cells, blood or moisture in human bodies (living bodies). The foregoing is well-known, and in this connection the presence or appearance of the positive static electricity is supposed to represent the decrease of anions.

For example, the interior of a running automobile is charged with positive electricity (700 to 1000 V) due to the friction of the automobile body with the air, whereby the driver becomes sleepy. That is, the static electricity is prone to cause car accidents. Not only automobiles, but also a variety of living environments produce the static electricity. Most of the articles including fluids produce static electricity, by way of familiar examples, image forming apparatuses using electron beams (TV sets, display devices and the like), fluorescent lamps, electric appliances such as air conditioners wherein liquid or gas flows, and devices using fluids such as petroleum, gas or the like (heaters and the like). Human bodies are exposed to the static electricity via these household appliances in considerably frequent occasions.

In the meantime, the potential in the air varies depending upon conditions of the weather and ground surface. For example, when a cold front or low atmospheric pressure passes, cations increase on the ground surface. Moreover, the concentration of cations is high also where an inverse wind or reverse wind rises easily. When cations increase, plants are hindered from growing well or badly damaged by diseases and pest insects. Meanwhile, when there is a columnar object standing straight on the ground surface, a slantwise potential difference increases in a space of a conical shape extending from the peak to the ground surface, so that a potential gradient is formed. In this conical space, the concentration of anions is high and therefore plants grow predominantly.

Among the factors influencing anion and cation concentrations other than the above, one is static electricity. In general, the cationic concentration is high in a positive electrostatic atmosphere, while the anionic concentration is high in a negative electrostatic atmosphere. In the case where about (+) 0.2 to 0.3 kV of static electricity exists in the atmosphere, it is possible to favorably raise crops if the static electricity is removed or turned into negative one. Particularly, when a vinyl house is used for raising crops, the external wind generates friction to the vinyl sheet, resulting in the increase of positive static electricity in the internal space. Besides, when the house is equipped with a ventilating means or air conditioning equipment, the stream of air is brought about inside the house, so that the positive static electricity is furthermore increased.

In order to eliminate such static electricity, there are a method whereby the electric charges are released quickly by increasing the conductivity of an object (e.g., by connecting the object to an earth line one end of which is buried in the ground), a method whereby ions having a different polarity are supplied to the generated electric charges by means of a discharging device utilizing an isotope or AC corona discharge thereby to neutralize the electric charges, a method of discharging the electricity in the air, etc.

It is, however, difficult to completely remove the static electricity in these methods, and it is needless to say that a large-scaled apparatus is required to turn the positive static electricity into negative.

SUMMARY OF THE INVENTION

The present invention has been made to eliminate the problems as described above and an object of the present invention is to provide a static electricity inverting material and a method for removing static electricity whereby the positive static electricity affecting human bodies can be eliminated without requiring any particular instrument.

A static electricity inverting material according to the present invention is characterized in that Si or $SiO_x$ (0<x<2) is vapor-deposited onto a base material.

Furthermore, a static electricity inverting material according to the present invention is characterized in that a silicon sheet made of Si or $SiO_x$ (0<x<2) is attached onto a base material by an adhesive.

Still further, a static electricity inverting material according to the present invention is Si or $SiO_x$ (0<x<2) shaped in a sheet-like or plate-like form.

Yet further, a static electricity inverting material according to the present invention is formed of Si, $SiO_x$ (0<x<2), or a mixture of Si or $SiO_x$ with an extender shaped into a sheet-like or plate-like form.

The above static electricity inverting material can turn the positive static electricity into substantially zero, and moreover into negative static electricity, so that adverse influences due to the positive static electricity can be avoided.

Regarding the composition of $SiO_x$, a good effect is obtained when x=1 to 1.95, and the best effect is obtained when x=1.5, whereas the inverting material is hardly effective if x=2.0 (i.e., $SiO_2$ which is an insulating material). It is desirable that the static electricity inverting material is negatively ionized, and the more ionized it is, the greater effect described above is obtained.

A method for removing static electricity according to the present invention is characterized in that a static electricity producing body is separated from a body receiving the static electricity (hereinafter referred to simply as "static electricity receiving body") by means of the static electricity inverting material having the above-mentioned constitution. In this method, when the static electricity producing body is isolated from the static electricity receiving body by means of the above-mentioned static electricity inverting material to such a degree as to make it hard for the static electricity to run ground, the static electricity can be reduced substantially to zero. Furthermore, if the static electricity producing body is perfectly isolated from the static electricity receiving body, the positive static electricity can be changed into negative one. Since the amount of anions is increased where the negative static electricity is present, it makes good to human bodies.

To separate the static electricity producing body from the static electricity receiving body, the surface of the static electricity producing body may be partly or totally coated with the static electricity inverting material of the present invention. Moreover, a space in which the static electricity receiving body exists may be covered with the static electricity inverting material.

Another object of the present invention is to provide a crop raising house and a method for raising crop whereby the positive static electricity can be turned into negative one by merely selecting a material for the house.

A crop raising house according to the present invention in a house wherein the crop is covered with a transparent material to raise the crop. The transparent material is characterized in a constitution that a silicon layer mainly composed of Si or $SiO_x$ (0<x<2) is disposed at one or both surfaces of a sheet-like or panel-like base material. The silicon layer may be formed by vapor-deposition of Si or $SiO_x$ or it may be prepared, for example, by attaching a silicon sheet separately formed to the base material.

Furthermore, the transparent material may be constituted of a silicon later mainly composed of Si or $SiO_x$ (0<x<2) held between sheet-like or panel-like base materials.

Moreover, the transparent material may be formed of Si or $SiO_x$ (0<x<2) with or without an extender.

In a crop raising house where air streams are presumed to flow, the positive static electricity may be presumed therein due to the friction of air and the sheet. Such a house as above producing the positive static electricity shows a high concentration of cations, and therefor the crop grows poorly. In the meantime, when the crop is grown in the crop rasing house according to the present invention, the positive static electricity can be turned into negative electricity, so that the amount of anions is increased in the vicinity of the crop. Accordingly, the crop grows dominantly, with damages by harmful insects and disease decreased.

A good effect is obtained where x=1 to 1.95 in $SiO_x$, and the best effect is obtained where x=1.5. It is desirable that the transparent material is negatively ionized, and the more ionized it is, the greater effect mentioned above is obtained.

The above and further objects and features of the invention will be more fully be apparent from the following detailed description with accompanying drawings.

BRIEF DESCRIPTION OF THE DRAWINGS

FIG. 3 is a graphical representation of the electrostatic voltage in lapse of time when the static electricity inverting material according to the present invention is used;

DESCRIPTION OF THE PREFERRED EMBODIMENTS

Figure 1A:
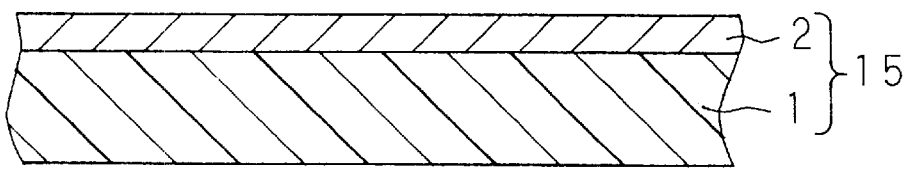
FIG. 1A is an enlarged sectional view showing a constitution of a static electricity inverting material according to the present invention.
Figure 1B:
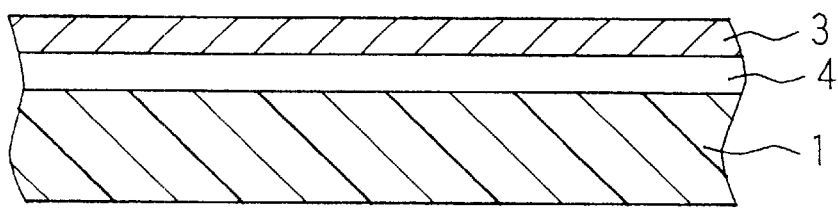
FIG. 1B is an enlarged sectional view showing a constitution of a static electricity inverting material according to the present invention.
Figure 1C:
FIG. 1C is an enlarged sectional view showing a constitution of a static electricity inverting material according to the present invention.
Figure 1D:
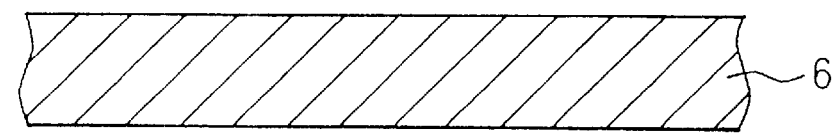
FIG. 1D is an enlarged sectional view showing a constitution of a static electricity inverting material according to the present invention.

In the following, the present invention will be described in detail with the accompanying drawings illustrating embodiments of the invention. Each of FIGS. 1A through 1D is an enlarged sectional view showing the constitution a static electricity inverting material according to the present invention. FIG. 1A shows the static electricity inverting material which is prepared by vapor-depositing Si or $SiO_x$ ($0<x<2$) onto either surface of a film-like or sheet-like base material 1 composed of a synthetic resin such as PET (polyethylene terephthalate) or the like to form a silicon film 2. An example of the material in such constitution as described above is "Techbarrier" (trade name) manufactured by Mitsubishi Kagaku K.K. and this material having an extremely low permeability with respect to oxygen and moisture is used as a food packaging material. FIG. 1B shows the static electricity inverting material which is prepared by bonding a silicon sheet 3 made of Si or $SiO_x$ with the base material 1 via a thermoplastic synthetic resin adhesive material 4. FIG. 1C shows the static electricity inverting material, i.e., a silicon mixed plate 5 composed of a mixture of Si or $SiO_x$ and another material (for example, a synthetic resin, urethane or the like). FIG. 1D shows the static electricity inverting material of a silicon plate 6 formed of Si or $SiO_x$.

In the following, a method for manufacturing each of the above-mentioned static electricity inverting materials will be described.

A silicon vapor-deposition device into which $SiO_x$ gas is introduced is utilized to vapor-deposit the $SiO_x$ on the base material 1 having a thickness of 7 to 41 μm, whereby the silicon film 2 having a thickness of 80 to 1050 Å is formed on either surface of the base material 1. The static electricity inverting material (silicon vapor-deposited sheet 15) shown in FIG. 1A is thus manufactured.

The silicon sheet 3 having a thickness of 0.03 to 15.3 mm is bonded to either surface of the base material 1 having a thickness of 0.3 to 7.7 mm by the adhesive 4 having a thickness of 3 to 15 μm, whereby the static electricity inverting material shown in FIG. 1B is manufactured.

Si, $SiO_x$, or a mixture of either Si or $SiO_x$ and another material is injected into a prescribed casting mold, so that the silicon mixed plate 5 or the silicon plate 6 of a required thickness is manufactured (FIGS. 1C and 1D). Otherwise a block of silicon material may be prepared from Si, $SiO_x$, or a mixture of either Si or $SiO_x$ and another material, and the resulting material may be sliced into a required thickness to obtain the static electricity inverting material of the invention. In this respect, the inverting material is obtained in a variety of modes such as rubber-like, sponge-like and similar modes depending on the kind of the above described mixture.

These static electricity inverting materials may be used in a variety of manners, for example, placed on a table, attached by means of a tape, etc., employed as a wrapping material and the like manners.

In the following, the measured results of the static electricity generated from a TV set when the silicon vapor-deposited sheet 15 is used under various conditions will be described. In this test, a 14-inch monochrome TV set was used, and an electrostatic voltage measuring device (manufactured by Kasuga Denki, model KSD-0102) was employed to measure the static electricity for one minute.

Figure 2A:
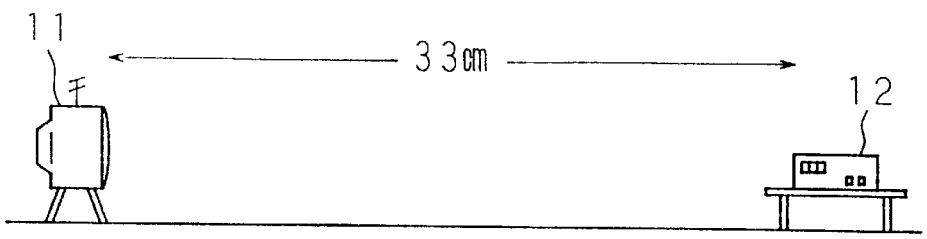
FIG. 2A is an explanatory view showing a condition at the time of measuring an electrostatic voltage.

The test was conducted under 5 measuring conditions shown in FIGS. 2A through 2E. FIG. 2A illustrates a comparative condition in which the electrostatic voltage measuring device 12 is disposed at a position 33 cm apart from the front face of the screen of the TV set 11, in other words, no object exists between the TV set 11 and the electrostatic voltage measuring device 12.

Figure 2B:
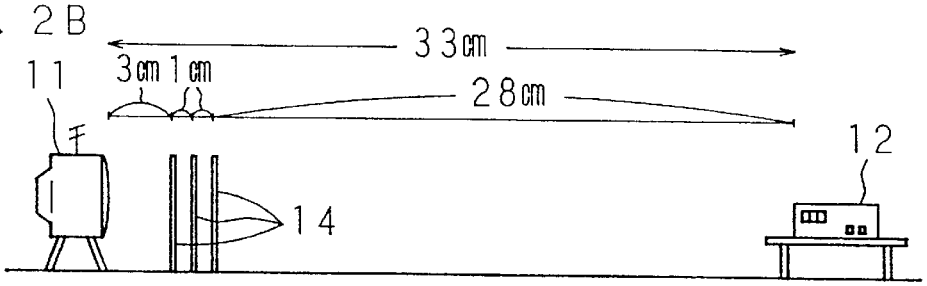
FIG. 2B is an explanatory view showing a condition at the time of measuring the electrostatic voltage.
Figure 2C:
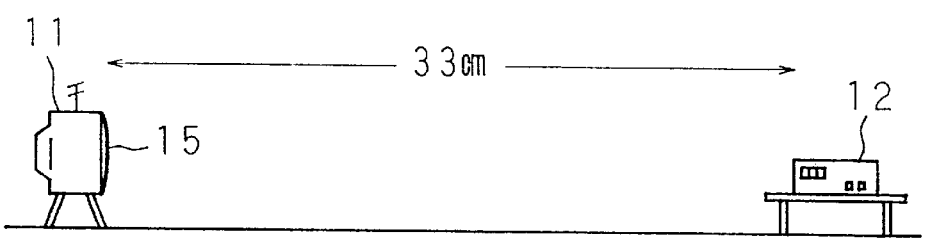
FIG. 2C is an explanatory view showing a condition at the time of measuring the electrostatic voltage.
Figure 2D:
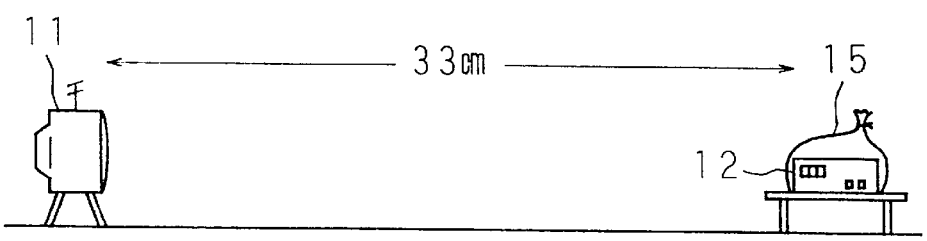
FIG. 2D is an explanatory view showing a condition at the time of measuring the electrostatic voltage.
Figure 2E:
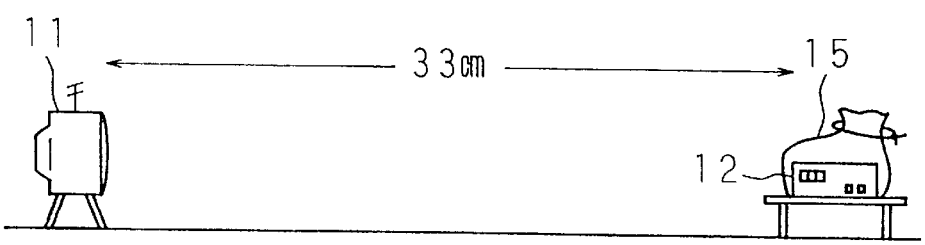
FIG. 2E is an explanatory view showing a condition at the time of measuring the electrostatic voltage.

In FIG. 2B, three shielding plates 14 each of which is prepared by attaching the silicon vapor-deposited sheet 15 to either side of a glass plate having a size of 40 cm×60 cm by means of a double-sided tape are disposed respectively at positions 3, 4 and 5 cm separated from the front face of the screen of the TV set 11 in such a manner that the silicon films 2, not the base materials 1, are faced to the electrostatic voltage measuring device 12. In FIG. 2C, the silicon vapor-deposited sheet 15 is bonded to the screen of the TV set 11 with the use of a double-sided tape. In FIG. 2D, the electrostatic voltage measuring device 12 is covered with the silicon vapor-deposited sheet 15. In FIG. 2E, the electrostatic voltage measuring device 12 is covered with the silicon vapor-deposited sheet 15, with an opening preserved. In cases of FIGS. 2D and 2E, the silicon film 2 of each silicon vapor-deposited sheet 15 is directed inside.

In any of the above described conditions, a distance defined between the TV set 11 and the electrostatic voltage measuring device 12 is kept constant, i.e., 33 cm.

Under the condition shown in FIG. 2A, the electrostatic voltage varied in accordance with the change in ratio of black and white areas in the screen of the TV set 11, that is, from (+) 0.2 to (+) 0.3 kV. Also in the conditions shown in FIGS. 2B and 2C, the electrostatic voltage varied in accordance with the change in ratio of black and white areas in the screen of the TV set 11 as in the condition shown in FIG. 2A, and (+) 0.2 to 0.3 kV was measured. Judging from the fact that the same results were measured under the conditions shown in FIGS. 2B and 2C, it is found that the static electricity discharged from the TV set 11 goes round the silicon vapor-deposited sheet 15 attached to the screen of the TV set 11 or the shielding plates 14, hence 100% reaching the electrostatic voltage measuring device 12.

The measured result under the condition shown in FIG. 2D is shown in FIG. 3. The voltage at the start of the measurement was (−) 33 kV, and gradually changed thereafter to (−) 0.2 to 0.3 kV in one minute.

Under the condition shown in FIG. 2E, the static electricity varied from (−) 0.3 to (+) 0.3 kV in proportion to a size of the opening.

From the above measured results, it is understood that when the space between the static electricity producing body and the measuring device is completely shut by means of the static electricity inverting material, it is possible to turn the positive static electricity into negative one. Accordingly, when the static electricity producing body is completely covered with the static electricity inverting material, the static electricity producing body can be converted to a negative static electricity producing body achieving the same effect as an anion generator. The principle based on which, under the condition shown in FIG. 2D, the voltage once decreases to (−) 33 kV, and then reaches a stationary state at (−) 0.2 to 0.3 kV is considered to be as follows. The static electricity of about (+) 33 kV is temporarily produced due to the friction with air when the electrostatic voltage measuring device 12 is wrapped with the silicon vapor-deposited sheet 15. This silicon vapor-deposited sheet 15 inverts the static electricity, to (−) 33 kV and eventually (−) 33 kV is measured. Thereafter, the static electricity of (+) 0.2 to 0.3 kV in the room is inverted and stabilized at (−) 0.2 to 0.3 kV. It is to be noted that the static electricity produced when the electrostatic voltage measuring device 12 is wrapped with the silicon vapor-deposited sheet 15 varies depending upon the shape, size, state (presence/absence of wrinkles), wrapping manner, and room environment of the silicon vapor-deposited sheet 15 (from (+) 0.3 to 77 kV), so that the measured value varies within a range of (−) 0.3 to 77 kV which is a value with an inverted sign.

Even if the static electricity is shut not completely, it is possible to make the electrostatic voltage substantially zero if the space between the static electricity producing body and the measuring device is shielded by the static electricity inverting material to such a degree as to hinder the static electricity from running around.

In place of covering the electrostatic voltage measuring device 12 with the static electricity inverting material as shown in FIGS. 2D and 2E, the TV set 11 may be covered with the static electricity inverting material.

While the TV set is employed as the static electricity producing body in the above described embodiments, the present invention may also be applied to electrical equipment such as fluorescent lamps, air conditioners and the like, as well as appliances using fluid such as petroleum, gas or the like (heaters and the like). Furthermore, the present invention may be similarly applied to a housing space (including buildings, automobiles, ships, and aircrafts) isolated perfectly or imperfectly from the outside where the static electricity exists by attaching the static electricity inverting material to the wall surface of the housing space or by the like manner. As a result, since the positive static electricity is removed, favorable effects are attained, for instance, the shoulder stiffness is eased, drowsiness is prevented, etc. In this case, as the positive static electricity is turned into negative one, one feels refreshed as if during a walk through the woods, similar to the case where an anion generator is installed.

Good results were obtained where x=1 to 1.95 in $SiO_x$, and the best result was obtained where x=1.5, while any effect was hardly obtained where x=2.0 (i.e., an insulating material of $SiO_2$). It is desirable that the static electricity inverting material is negatively ionized, and the more ionized it is, the greater effect described above is obtained.

The raw material for the above-mentioned base materials 1 may suitably be selected depending upon the use thereof. Moreover, it is to be noted that the base material 1, the silicon film 2, the silicon sheet 3, and the adhesive 4 are not limited to the above-mentioned thickness.

As described above, when the static electricity inverting material according to the present invention is used, it is possible to completely eliminate the positive static electricity adversely influencing human bodies, so that the adverse effects by the positive static electricity can be avoided. It is also possible to turn the positive static electricity into negative one which gives favorable influence on human bodies. In the case when a static electricity producing body is covered with the static electricity inverting material completely, the positive static electricity is changed to negative one. For a static electricity producing body like an air conditioner which cannot function effectively if completely covered, the static electricity producing body may be partly covered with the static electricity inverting material into a partly opened state in accordance with the use thereof. The static electricity is substantially eliminated even in this case.

In the following, the static electricity inverting material according to the present invention is applied to a crop raising house used for growing the crop.

Figure 4A:
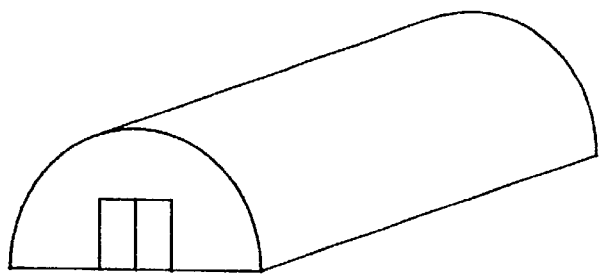
FIG. 4A is a perspective view showing a crop raising house according to the present invention.
Figure 4B:
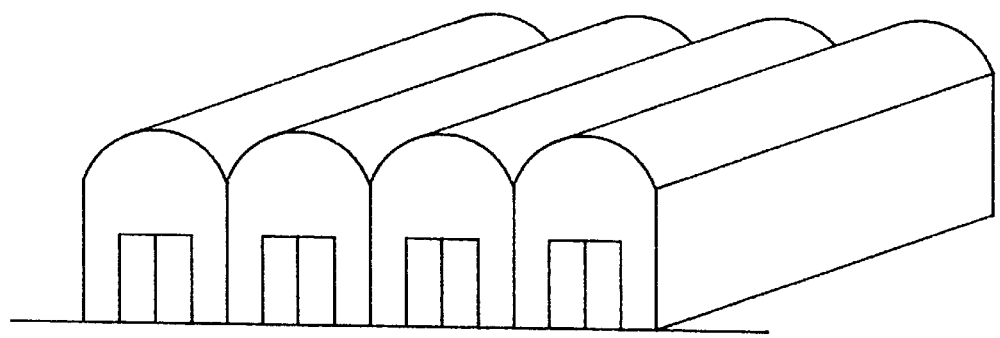
FIG. 4B is a perspective view showing a crop raising house according to the present invention.
Figure 4C:
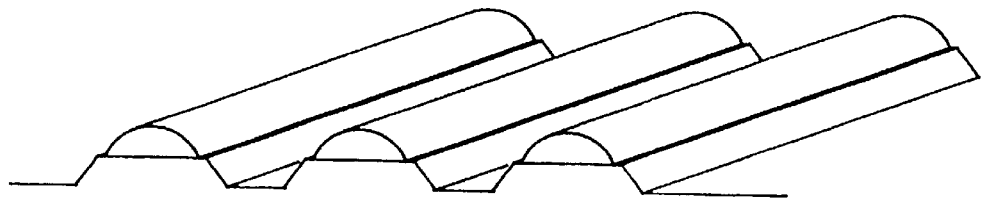
FIG. 4C is a perspective view showing a crop raising house according to the present invention.

FIGS. 4A through 4C are perspective views each showing the crop raising house according to the present invention. FIG. 4A shows a crop raising house provided with air conditioning equipment, FIG. 4B shows a crop raising house for use in growing grapes and the like, and FIG. 4C shows a crop raising house used for growing vegetables and the like. Each of these crop raising houses has a transparent sheet covering the frame of a predetermined profile.

Figure 5A:
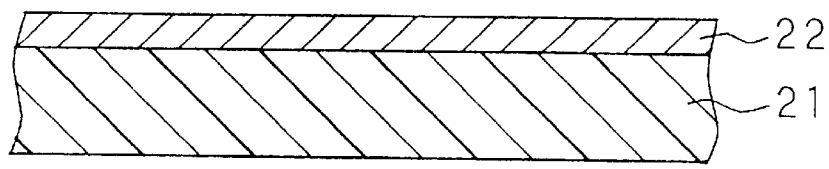
FIG. 5A is an enlarged sectional view showing a transparent sheet used in the crop raising houses shown in FIGS. 4A to 4C.

FIGS. 5A through 5E are enlarged sectional views each showing the structure of the transparent sheet used in the crop raising house. The transparent sheet shown in FIG. 5A is a silicon vapor-deposited sheet which is prepared by vapor-depositing Si or $SiO_x$ (0<x<2) approximately 100 to 6000 Å on either surface of a base material sheet 21 composed of polyvinyl chloride or polyethylene employed heretofore, PET (polyethylene terephthalate) or the like (having a thickness of 0.005 to 15 mm) thereby to form a silicon vapor-deposited film 22. An example of the sheet having the above constitution is "Techbarrier" (trade name) manufactured by Mitsubishi Kagaku K.K. and this sheet shows an extremely low permeability with respect to oxygen and water vapor, and is accordingly employed as a food packaging material. The silicon vapor-deposited sheet may be attached in use to an existing transparent sheet.

Figure 5B:
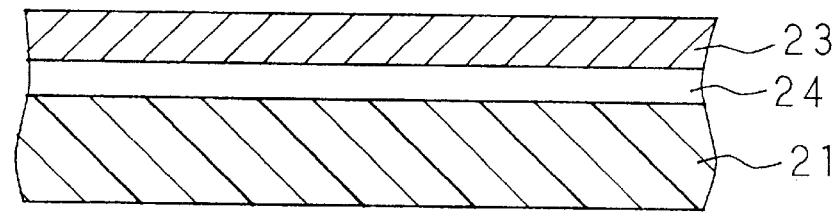
FIG. 5B is an enlarged sectional view showing a transparent sheet used in the crop raising houses shown in FIGS. 4A to 4C.

The transparent sheet shown in FIG. 5B is prepared by bonding a silicon sheet 23 of Si or $SiO_x$ (0<x<2) (having a thickness of 0.005 to 15 mm) to either surface of the base material sheet 21 composed of polyvinyl chloride, polyethylene, PET or the like (having a thickness of 0.005 to 15 mm) by a synthetic resin adhesive 24 having thermoplasticity.

Figure 5C:
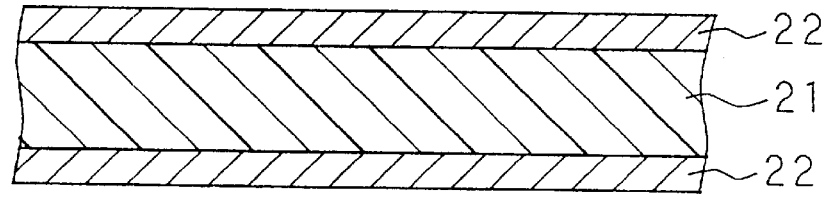
FIG. 5C is an enlarged sectional view showing a transparent sheet used in the crop raising houses shown in FIGS. 4A to 4C.
Figure 5D:
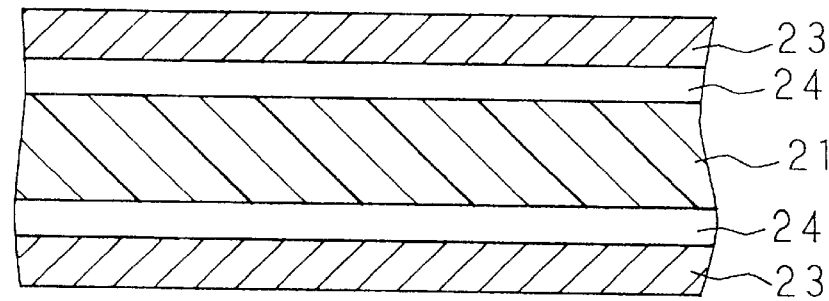
FIG. 5D is an enlarged sectional view showing a transparent sheet used in the crop raising houses shown in FIGS. 4A to 4C.

The transparent sheet shown in FIG. 5C is prepared by forming silicon vapor-deposited films 22 on both surfaces of the base material sheet 21. In this connection, silicon sheets 23 may be bonded to both surfaces of the base material sheet 21 via the adhesives 24 as shown in FIG. 5D.

Figure 5E:
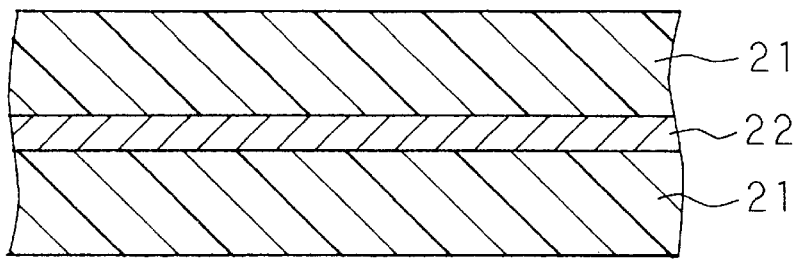
FIG. 5E is an enlarged sectional view showing a transparent sheet used in the crop raising houses shown in FIGS. 4A to 4C.
Figure 5F:
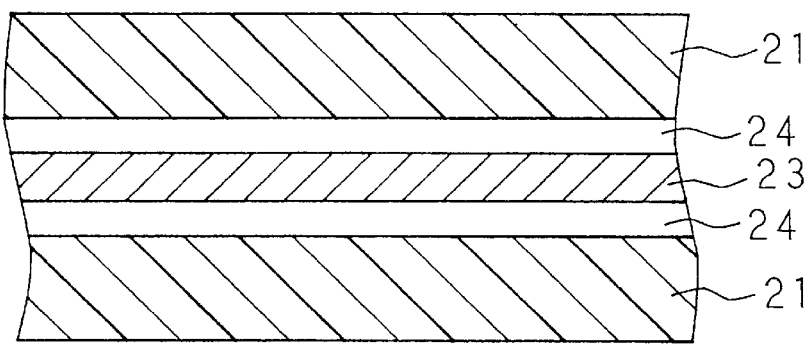
FIG. 5F is an enlarged sectional view showing a transparent sheet used in the crop raising houses shown in FIGS. 4A to 4C.

The transparent sheet shown in FIG. 5E has the silicon vapor-deposited film 22 held between the base material sheets 21. In this connection, the above-referred silicon sheet 23 may be inserted and bonded between the base material sheets 21 via the adhesives 24 as shown in FIG. 5F.

Figure 5G:
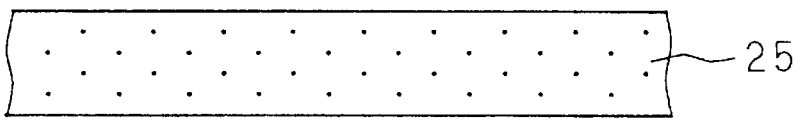
FIG. 5G is an enlarged sectional view showing a transparent sheet used in the crop raising houses shown in FIGS. 4A to 4C.
Figure 5H:
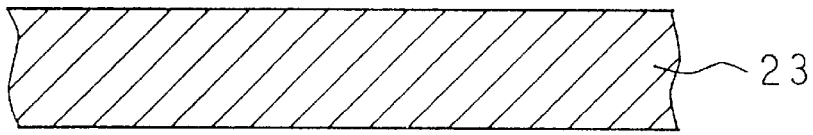
FIG. 5H is an enlarged sectional view showing a transparent sheet used in the crop raising houses shown in FIGS. 4A to 4C.

The transparent sheet shown in FIG. 5G is a silicon mixed sheet 25 formed of a base sheet raw material having Si or $SiO_x$ (0<x<2) mixed therein. A mixing ratio of Si or $SiO_x$ may be suitably selected within a range of 7 to 92% in conformity with the using purpose thereof so as to obtain required thickness, strength, flexibility, and transparence. Furthermore, the silicon mixed sheet 25 may also be formed of silicone resin. Moreover, a single body of the silicon sheet 23 may be used as the transparent sheet (FIG. 5H).

The static electricity measured in the above described embodiments by the use of the electrostatic voltage measuring device (model KSD-0102 manufactured by Kasuga Denki) will be described hereunder.

In the crop raising house provided with the air conditioning equipment shown in FIG. 4A, the conventionally measured (+) 0.5 kV was turned to (−) 0.5 kV in the present invention. In the crop raising houses shown in FIGS. 4B and 4C alike, the static electricity was changed to a negative value of about (−) 0.2 to 0.3 kV thereinside.

It was found from the measurements that the more tightly and perfectly th interior space is sealed by the silicon vapor-deposited sheet, the more easily the positive static electricity is turned to negative, and the positive static electricity is reduced or removed even when the sealing is partly opened.

The crops grow in the crop raising house according to the present invention at a higher speed than in the conventional house, with showing good quality. In addition, because of the high anion concentration, an extermination effect to pest insects is improved, as well as the antibacterial action.

Accordingly, damages to crops by disease and pest insects are lessened, so that the yield is increased.

In the crop raising house according to the present invention, since it is required only to change the material for the sheet, the house can be installed and used rather simply in comparison with the case where a large-scaled apparatus such as an anion generator or the like is employed, without necessitating an extra installation space for the apparatus. Furthermore, since no electric power is used, costs including material and maintenance costs are rendered relatively low in the present invention.

As a matter of course, the material for the base material sheet is not limited to those mentioned above. It is to be noted that the thickness of the base material sheet and the silicon layer (including the silicon vapor-deposited film and silicon sheet) may be suitably selected.

While the above-mentioned embodiments of the present invention are applied to a so-called vinyl house, the invention is applicable to a hothouse, and in this case, a panel may be employed in place of the base material sheet.

As described above, according to the crop raising house of the present invention, it is possible to turn the positive static electricity into negative, whereby the anion concentration inside the crop raising house raising crops therein is enhanced. The effect is increased as the interior space of the house is sealed more tightly. Therefore, when crops are grown in the crop raising house according to the present invention, the growth rate of the crops is high, the quality of the harvested crops is good, and damages from disease and pest insects are decreased, so that the yield is enriched.

As this invention may be embodied in several forms without departing from the spirit of essential characteristics thereof, the present embodiments are therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

What is claimed is:

1. A method for controlling static electricity in a receiving body containing static electrivity comprising:
   providing a negatively ionized static electricity inverting material in sheet or panel form including a layer of a base material and a layer of Si or $SiO_x$ (0<X<2); and
   isolating a static electricity producing body from said static electricity receiving body using said static electricity inverting material.

2. A method according to claim 1, wherein said layer of Si or $SiO_x$ is vapor deposited on one surface of said base material layer.

3. A method for removing static electricity according to claim 2 wherein a part of or the whole of the surface of said static electricity producing body is covered with said static electricity inverting material.

4. A method for removing static electricity according to claim 2 wherein said step of isolating comprises covering a space containing said static electricity receiving body electrically charged through connection with the external space with said static electricity inverting material.

5. A method according to claim 1 wherein said layer of Si or $SiO_x$ is a vapor deposited layer on both surfaces of said base material layer.

6. A method for removing static electricity according to claim 5 wherein a part of or the whole of the surface of said static electricity producing body is covered with said static electricity inverting material.

7. A method for moving static electricity according to claim 5 wherein said step of isolating covering a space containing said static electricity receiving body electrically charged through connection with the external space with static electrically inverting material.

8. A method according to claim 1 wherein said layer of Si or $SiO_x$ comprises a sheet or panel of Si or $SiO_x$ attached to one surface of said base material layer.

9. A method for removing static electricity according to claim 8 wherein a part of or the whole of the surface of said static electricity producing body is covered with said static electricity inverting material.

10. A method for removing static electricity according to claim 8 wherein said step of isolating comprises covering a space containing said static electricity receiving body electrically charged through connection with the external space with said static electricity inverting material.

11. A method according to claim 1 wherein said layer of Si or $SiO_x$ comprises a sheet or panel of Si or $SiO_x$ attached to both surfaces of said base material layer.

12. A method for removing static electricity according to claim 11 wherein a part of or the whole of the surface of said static electricity producing body is covered with said static electricity inverting material.

13. A method for removing static electricity according to claim 11 wherein said step of isolating comprises covering a space containing said static electricity receiving body electrically charged through connection with the external space with said static electricity inverting material.

14. A method as in claim 1 wherein said static electrically inverting material is in sheet or panel form and is a mixture of the Si or $SiO_x$ with another material.

15. A method for removing static electricity according to claim 14 wherein a part of or the whole of the surface of said static electricity producing body is covered with said static electricity inverting material.

16. A method for removing static electricity according to claim 14 wherein said step of isolating comprises covering a space containing the static electricity receiving body electrically charged through connection with the external space with said static electricity inverting material.

17. A method for removing static electricity according to claim 1 wherein a part of or the whole of the surface of said static electricity producing body is covered with the static electricity inverting material.

18. A method for removing static electricity according to claim 1 wherein said step of isolating comprises covering a space containing said static electricity receiving body with said static electricity inverting material to prevent said receiving body from being electrically charged by factors outside of said space containing said receiving body.

19. A method for removing static electricity according to claim 1 wherein said step of isolating comprises covering a space containing said static electricity receiving body electrically charged through connection with the external space with said static electricity inverting material.

* * * * *